United States Patent
Pan

(10) Patent No.: US 11,337,322 B2
(45) Date of Patent: May 17, 2022

(54) ADJUSTABLE FOLDABLE COMPUTER BRACKET

(71) Applicant: Dongguan Xindingjian Electronic Technology Co., Ltd., Dongguan (CN)

(72) Inventor: Shicai Pan, Yangxin (CN)

(*) Notice: Subject to any disclaimer, the term of this patent is extended or adjusted under 35 U.S.C. 154(b) by 0 days.

(21) Appl. No.: 17/347,579

(22) Filed: Jun. 14, 2021

(65) Prior Publication Data

US 2021/0307187 A1 Sep. 30, 2021

(30) Foreign Application Priority Data

Jan. 9, 2021 (CN) .......................... 202120048876.9

(51) Int. Cl.
*F16M 11/00* (2006.01)
*H05K 5/02* (2006.01)
*F16M 11/26* (2006.01)
*F16M 11/38* (2006.01)

(52) U.S. Cl.
CPC .......... *H05K 5/0234* (2013.01); *F16M 11/26* (2013.01); *F16M 11/38* (2013.01); *H05K 5/0204* (2013.01)

(58) Field of Classification Search
CPC .. H05K 5/0234; H05K 5/02024; F16M 11/26; F16M 11/38
USPC ......... 248/125.8, 441.1, 448, 454, 456, 460, 248/463, 274.1, 125.9; 361/679.21, 361/679.02, 679.55, 679.56, 679.05
See application file for complete search history.

(56) References Cited

U.S. PATENT DOCUMENTS

| | | | |
|---|---|---|---|
| 10,638,626 B1* | 4/2020 | Park | H05K 5/0017 |
| 10,979,605 B2* | 4/2021 | Murphy | H04N 5/2256 |
| 2006/0158427 A1* | 7/2006 | Goldenberg | H04N 5/2628 |
| | | | 345/156 |
| 2009/0272779 A1 | 11/2009 | Vu | |
| 2012/0248277 A1 | 10/2012 | Yang et al. | |
| 2013/0213838 A1 | 8/2013 | Tsai | |
| 2015/0066511 A1* | 3/2015 | Baek | H04M 1/04 |
| | | | 704/260 |
| 2020/0138186 A1* | 5/2020 | Haham | A47B 23/043 |

FOREIGN PATENT DOCUMENTS

CN 207039713 U * 2/2018

* cited by examiner

*Primary Examiner* — Todd M Epps

(57) ABSTRACT

The present disclosure provides a height and angle-adjustable foldable computer bracket, including a bottom plate, a support plate, and expansion and retraction brackets connected between the bottom plate and the support plate. First connecting lugs are respectively arranged at the top of the bottom plate and the bottom of the support plate. Second connecting lugs are arranged at two ends of the expansion and retraction brackets. Shaft holes are formed in the first connecting lugs and the second connecting lugs. A rotating shaft structure is mounted between each first connecting lug and the corresponding second connecting lug. Engaging teeth are formed in the shaft holes. The rotating shaft structure includes: a rotating shaft with the engaging teeth, a limiting shaft with the engaging teeth, and a returning piece.

10 Claims, 4 Drawing Sheets

ADJUSTABLE FOLDABLE COMPUTER BRACKET

TECHNICAL FIELD

The present disclosure relates to the technical field of computer brackets, and in particular, to a height and angle-adjustable foldable computer bracket.

BACKGROUND

It is necessary to adjust the angle or the height of a computer screen according to the factors, such as the sitting posture of a user and the height of a chair, when a computer is used. In the prior art, the angle and the height of the computer are mainly adjusted through a computer bracket.

The basic structure of the existing angle and height-adjustable foldable computer bracket includes: a bottom, a support part, and an expansion and retraction structure. The connections among the bottom, the support part, and the expansion and retraction structure are generally rotated or limited through dampers or the friction between two of them. Under this structure, the support is instable after repeated use, in addition, this structure is complex, the assembly difficulty is high, and the production cost is increased.

SUMMARY

In view of the disadvantages in the prior art, the present disclosure provides a height and angle-adjustable foldable computer bracket, which solves the technical problems that the support is instable after repeated use, in addition, the structure is complex, the assembly difficulty is high, and the production cost is increased.

According to an embodiment of the present disclosure, a height and angle-adjustable foldable computer bracket includes: a bottom plate, a support plate, and expansion and retraction brackets connected between the bottom plate and the support plate; first connecting lugs are respectively arranged at the top of the bottom plate and the bottom of the support plate; second connecting lugs are arranged at two ends of the expansion and retraction brackets; shaft holes are formed in the first connecting lugs and the second connecting lugs;

a rotating shaft structure is mounted between each first connecting lug and the corresponding second connecting lug;

engaging teeth are formed in the shaft holes;

the rotating shaft structure includes: a rotating shaft with engaging teeth, a limiting shaft with engaging teeth, and a returning piece;

the rotating shaft is mounted in a penetrating manner and is engaged with the first connecting lug and the second connecting lug to correspondingly limit the rotation between the bottom plate and the expansion and retraction brackets and the rotation between the support plate and the expansion and retraction brackets;

the limiting shaft is mounted on the first connecting lug, and the limiting shaft moves axially to push the rotating shaft to be separated from the first connecting lug to correspondingly make the bottom plate rotate relative to the expansion and retraction brackets and make the support plate rotate relative to the expansion and retraction brackets;

the returning piece provides a returning force for inserting the rotating shaft into the first connecting lug again.

Further, the expansion and retraction bracket includes an expansion and retraction adjustment outer pipe and an expansion and retraction adjustment inner pipe that are telescopically connected. An expansion and retraction adjustment piece is arranged on the outer surface of the expansion and retraction adjustment outer pipe in a sleeving manner. The expansion and retraction adjustment piece is axially connected to the expansion and retraction adjustment outer pipe in a sliding manner. When the expansion and retraction adjustment piece and the expansion and retraction adjustment outer pipe slide reciprocally axially, the expansion and retraction adjustment outer pipe and the expansion and retraction adjustment inner pipe slide telescopically relatively or are fixed relatively.

Further, through holes are formed in the expansion and retraction adjustment outer pipe. A plurality of clamping grooves matched with the through holes are formed in the expansion and retraction adjustment inner pipe. The plurality of the clamping grooves are distributed in the axial direction of the expansion and retraction adjustment inner pipe. The expansion and retraction adjustment piece includes a key spring clamping sleeve and a gear adjustment steel ball. The key spring clamping sleeve is arranged on the expansion and retraction adjustment outer pipe in a sleeving manner. When the key spring clamping sleeve and the expansion and retraction adjustment outer pipe slide reciprocally axially, the gear adjustment steel ball is clamped into or slides out corresponding through hole and clamping groove.

Further, a spring used for making the key spring clamping sleeve and the expansion and retraction adjustment outer pipe slide reciprocally axially is arranged between the key spring clamping sleeve and the expansion and retraction adjustment outer pipe.

Further, a ball fixing sleeve is fixedly arranged in an end, in the key spring clamping sleeve, of the expansion and retraction adjustment outer pipe. The ball fixing sleeve is arranged on the outer surface of the expansion and retraction adjustment inner pipe in a sliding and sleeving manner. The through holes are formed in the side wall of one end, far away from the expansion and retraction adjustment outer pipe, of the ball fixing sleeve. A bulge used for pressing the gear adjustment steel ball into the through hole and the clamping groove that are communicated with each other is formed on the inside wall of the key spring clamping sleeve. The spring is arranged between the bulge and the end, connected to the ball fixing sleeve, of the expansion and retraction adjustment outer pipe.

Further, multiple expansion and retraction brackets are arranged between the bottom plate and the support plate. A linkage piece is arranged between every two of the multiple expansion and retraction brackets. The linkage pieces are used for driving the spring to compress.

Further, the linkage piece includes a first expansion and retraction key and a second expansion and retraction key that are telescopically matched with each other. The first expansion and retraction key is connected outside the key spring clamping sleeves of two adjacent expansion and retraction brackets in a clamping manner. The second expansion and retraction key is connected to the expansion and retraction adjustment outer pipes of two adjacent expansion and retraction brackets in a clamping manner.

Further, a chute and a sliding column that are telescopically connected are arranged on the opposite sides of the first expansion and retraction key and the second expansion and retraction key.

Further, a convex ring is fixedly arranged on the expansion and retraction adjustment outer pipe between the second expansion and retraction key and the key spring clamping sleeve; the second expansion and retraction key is arranged outside the expansion and retraction adjustment outer pipe in a sleeving manner and is arranged close to the convex ring.

Further, a hole for the expansion and retraction adjustment inner pipe to penetrate and slide relatively is formed in the first expansion and retraction key; one end, far away from the second expansion and retraction key, of the key spring clamping sleeve is fixedly arranged on the inner surface of the hole.

It can be known from the above-mentioned technical solution that, compared with the prior art, the present disclosure has the following beneficial effects:

1. Compared with the traditional structure, the rotating shaft structure used in the present disclosure has less components and parts, is more convenient to assemble, and effectively reduces the production cost. Meanwhile, the rotating shaft structure of the present disclosure is convenient to use, can be adjusted and positioned at any angle, and can be adjusted in a wide range.

2. The expansion and retraction adjustment outer pipes and the expansion and retraction adjustment inner pipes used in the present disclosure are telescopically connected. The expansion and contraction of the expansion and retraction adjustment outer pipes and the expansion and retraction adjustment inner pipes can be adjusted through the expansion and retraction adjustment pieces arranged outside the expansion and retraction adjustment outer pipes in a sleeving manner. The load of a radial force between the each telescopic adjustment outer pipe and the corresponding telescopic adjustment inner pipe to a joint is dispersed by applying a force to the axial direction of the expansion and retraction adjustment outer pipe through the expansion and retraction adjustment piece, so the problem that the support is instable after long-time use is avoided, the structure is simple and is easy to assemble, and the cost is low.

Figure 1:
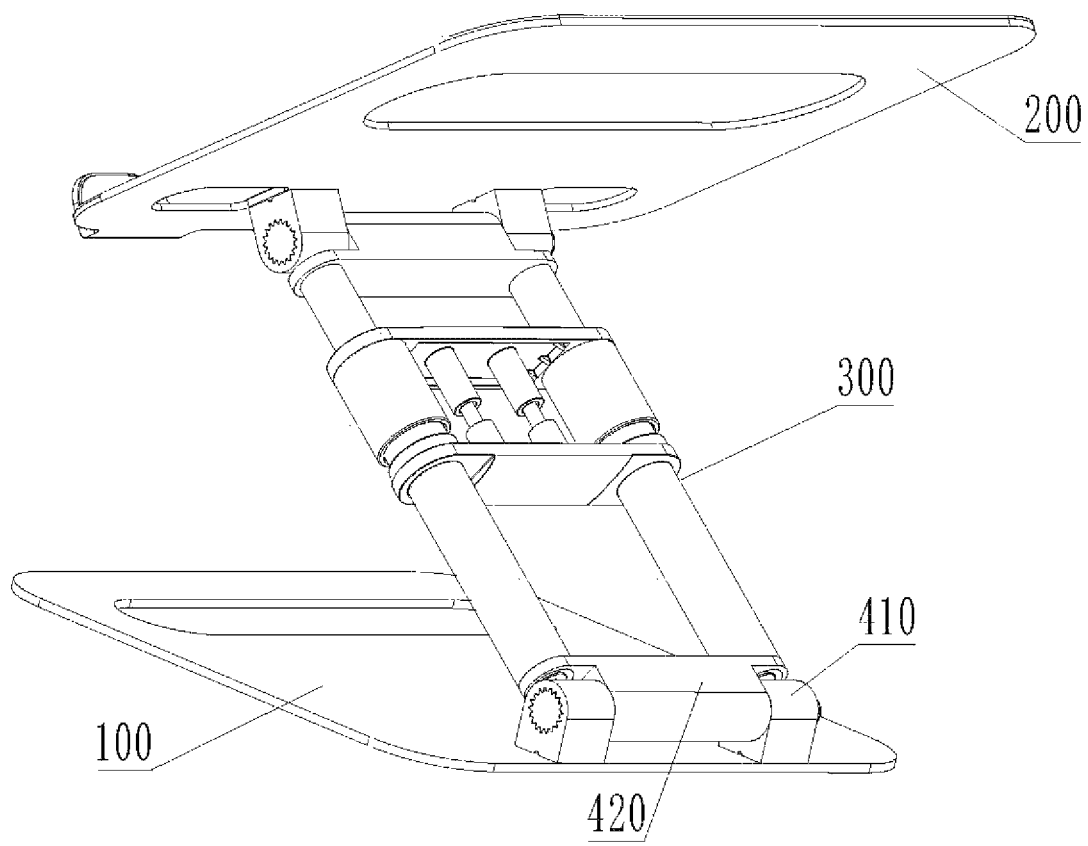
FIG. 1 is a schematic structural diagram of a whole body of an embodiment of the present disclosure.

Reference signs in drawings: 100—bottom plate; 200—support plate; 300—expansion and retraction bracket; 310—first expansion and retraction key; 311—chute; 320—second expansion and retraction key; 321—sliding column; 330—expansion and retraction adjustment outer pipe; 331—convex ring; 340—expansion and retraction adjustment inner pipe; 341—clamping groove; 350—key spring clamping sleeve; 351—bulge; 360—spring; 370—ball fixing sleeve; 371—through hole; 380—gear adjustment steel ball; 410—first connecting lug; 411—left lug part; 412—right lug part; 420—second connecting lug; 511—shaft part; 512—tooth part; 521—limiting shaft; 522—key rubber sleeve; 523—concentric rubber sleeve; 530—mounting shaft; 531—first shaft rod; 532—second shaft rod; 540—returning spring; 550—tightness fixing shaft; 560—tightness fixing rubber sleeve.

DESCRIPTION OF THE EMBODIMENTS

The technical solution in the present disclosure is further described below in combination with accompanying drawings and embodiments.

As shown in FIG. 1 to FIG. 5, the embodiment of the present disclosure provides a height and angle-adjustable foldable computer bracket, including a bottom plate 100, a support plate 200, and expansion and retraction brackets 300 connected between the bottom plate 100 and the support plate 200. The bottom plate 100 is used for supporting the whole foldable computer bracket on a horizontal plane. The support plate 200 is used for placing a notebook computer. The expansion and retraction brackets 300 are used for adjusting height. Baffle plates used for limiting the notebook computer placed on the support plate 200 are arranged thereon. Specifically, two baffle plates are arranged and are fixedly arranged at the edge of the support plate 200. The baffle plates are arranged perpendicular to the support plate 200. First connecting lugs 410 are respectively arranged at the top of the bottom plate 100 and the bottom of the support plate 200. Second connecting lugs 420 are arranged at two ends of the expansion and retraction brackets 300. The first connecting lugs 410 and the second connecting lugs 420 are connected through rotating shaft structures, so that the bottom plate 100 and the expansion and retraction bracket 300 can be positioned and rotated relatively, and the support plate 200 and the expansion and retraction bracket 300 can be positioned and rotated relatively, which can complete the adjustment of angle and the positioning at any angle. In addition, the rotating shaft structures are simple and convenient to use.

Figure 2:
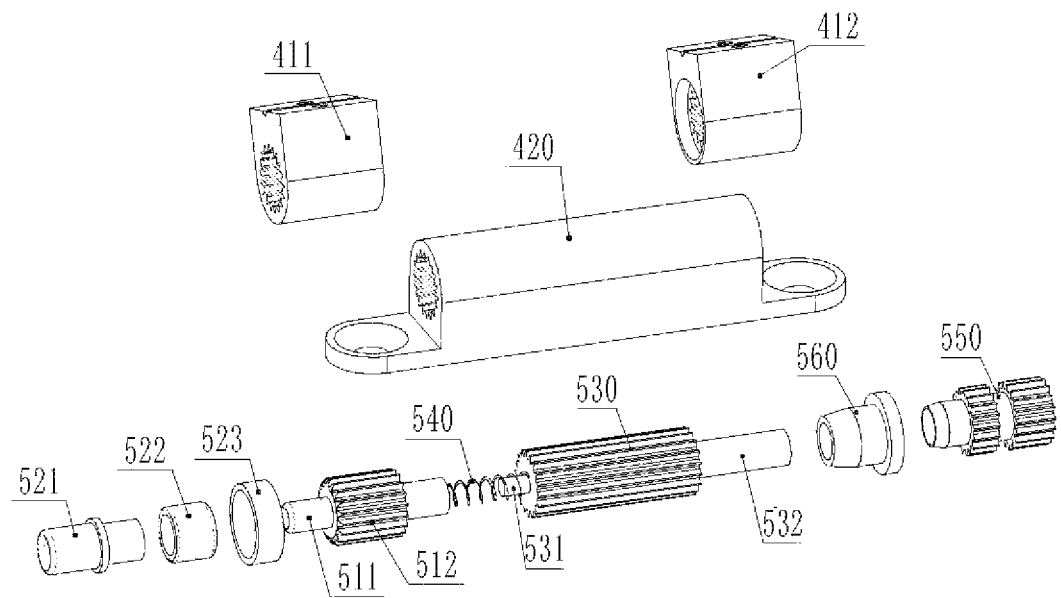
FIG. 2 is a schematic structural diagram of a first connecting lug, a second connecting lug, and a rotating shaft component of the embodiment of the present disclosure.

As shown in FIG. 1 and FIG. 2, shaft holes are formed in the first connecting lugs 410 and the second connecting lugs 420. The shaft holes are used for mounting the rotating shaft structures. Engaging teeth are formed in the shaft holes. The rotating shaft structure includes: a rotating shaft with engaging teeth, a limiting shaft 521 with engaging teeth, a mounting shaft 530 with engaging teeth, a tightness fixing shaft 550, a tightness fixing rubber sleeve 560, and a returning piece, where the returning piece is a returning spring 540.

The rotating shaft is mounted in a penetrating manner and is engaged with the first connecting lug and the second connecting lug to correspondingly limit the rotation between the bottom plate 100 and the expansion and retraction brackets 300 and the rotation between the support plate 200 and the expansion and retraction brackets 300. The limiting shaft 521 is mounted in the first connecting lug 410, and the limiting shaft 521 moves axially to push the rotating shaft to be separated from the first connecting lug 410 to correspondingly make the bottom plate 100 rotate relative to the expansion and retraction brackets 300 and make the support plate 200 rotate relative to the expansion and retraction brackets 300;

the returning piece provides a returning force for inserting the rotating shaft into the first connecting lug 410 again.

Specifically, the first connecting lug 410 includes: a left lug part 411 and a right lug part 412. The second connecting lug 420 is positioned between the left lug part 411 and the right lug part 412.

The rotating shaft includes: a shaft part 511 and a tooth part 512. The shaft part 511 and the tooth part 512 are distributed in the axial direction. The outside diameter of the tooth part 512 is greater than that of the shaft part 511. The tooth part 512 is arranged in a sleeving manner and is fixed to the middle of the shaft part 511.

The limiting shaft 521 includes: a limiting rod, a clamping ring, and a connecting rod that are distributed axially. The limiting rod is coaxially and fixedly connected to the connecting rod. The clamping ring is fixedly arranged on the outer surface at the joint between the limiting rod and the connecting rod. The free end of the connecting rod sinks axially inwards to form a connecting groove. As shown in FIG. 2, the left end of the shaft part 511 penetrates through a concentric rubber sleeve 523 and a key rubber sleeve 522, and is fixed to the interior of the connecting groove of the connecting rod. The end surface of the right end of the shaft part 511 sinks axially inwards to form a spring groove.

The mounting shaft 530 includes a shaft rod and annular engaging teeth arranged on the shaft rod in a sleeving manner. The rotating rod includes a first shaft rod 531 and a second shaft rod 532 that are coaxially and fixedly connected. The radial dimension of the first shaft rod 531 is smaller than that of the second shaft rod 532. One end of the returning spring 540 extends into the spring groove. The other end of the returning spring 540 is arranged outside the first shaft rod 531 in a sleeving manner and presses against the left end of the annular engaging teeth as shown in FIG. 2.

Two annular fixing teeth are coaxially and fixedly arranged on the outer surface of the tightness fixing shaft 550. The left end of the tightness fixing shaft 550 penetrates through the tightness fixing rubber sleeve 560 and is arranged at the right end of the second shaft rod 532 in a sleeving manner.

When the height and angle-adjustable foldable computer bracket is mounted, the shaft part 511 is arranged between the left lug part 411 and the second connecting lug 420 in a penetrating manner. The left part of the tooth part 512 is inserted into the left lug part 411 for engaging. The right part of the tooth part 512 is inserted and mounted in the second connecting lug 420, i.e., the rotating shaft is simultaneously engaged with the left lug part 411 and the second connecting lug 420, so that the first connecting lug 410 cannot rotate relative to the second connecting lug 420, the bottom plate 100 and the expansion and retraction brackets 300 as well as the support plate 200 and the expansion and retraction brackets 300 are positioned and cannot rotated to adjust an angle, so that angle limitation is also provided.

When the limiting shaft 521 is pushed rightwards, the limiting shaft 521 drives the rotating shaft to move rightwards, so that the left end of the tooth part 512 of the rotating shaft is separated from the left lug part 411, and the connecting grove of the connecting rod moves rightwards to compress the returning spring 540 and simultaneously make the first shaft rod 531 extend into the spring groove. At this time, the tooth part 512 of the rotating shaft is separated from the first connecting lug 410, so that the bottom plate 100 can rotate relative to the expansion and retraction brackets 300, and the support plate 200 can rotate relative to the expansion and retraction brackets 300.

When an external force acting on the limiting shaft 521 disappears, the returning spring 540 pushes the rotating shaft to move leftwards again, the rotating shaft pushes the limiting shaft 521 to move leftwards, the rotating shaft is simultaneously engaged with the left lug part 411 and the second connecting lug 420 again to re-lock, so that the first connecting lug 410 cannot rotate relative to the second connecting lug 420. The above-mentioned rotating shaft structure is simple in structures, convenient to use, and easy to assemble, and effectively reduces the production cost.

Figure 3:
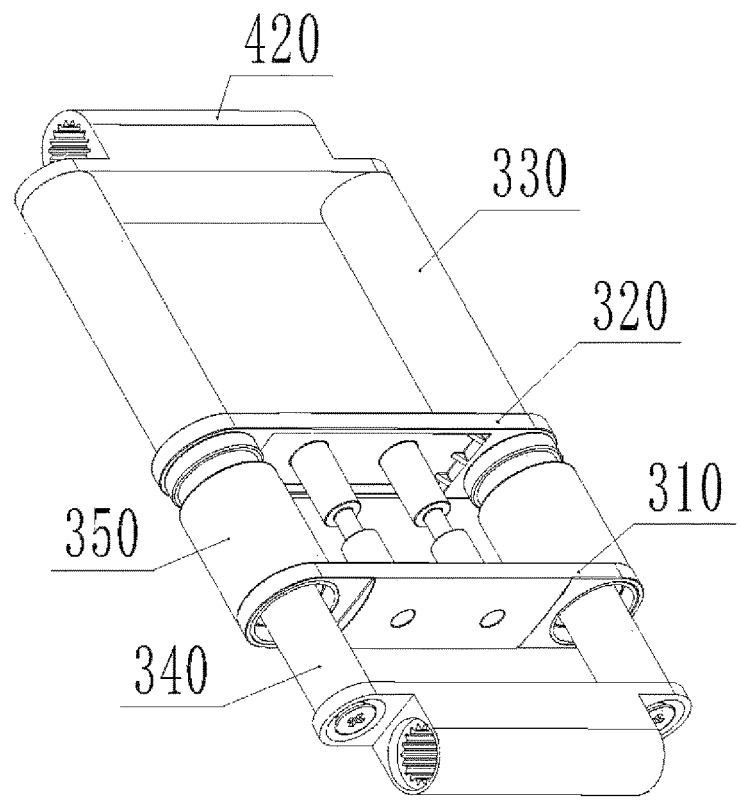
FIG. 3 is a schematic structural diagram of an expansion and retraction bracket of the embodiment of the present disclosure.
Figure 4:
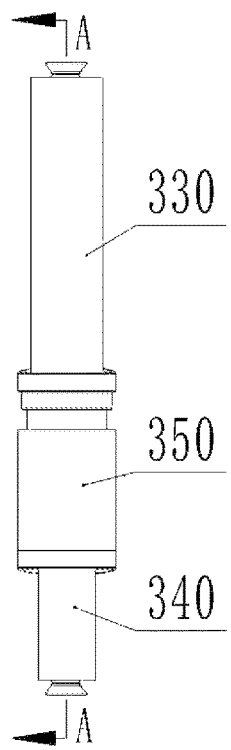
FIG. 4 is a side view of the expansion and retraction bracket of the embodiment of the present disclosure.
Figure 5:
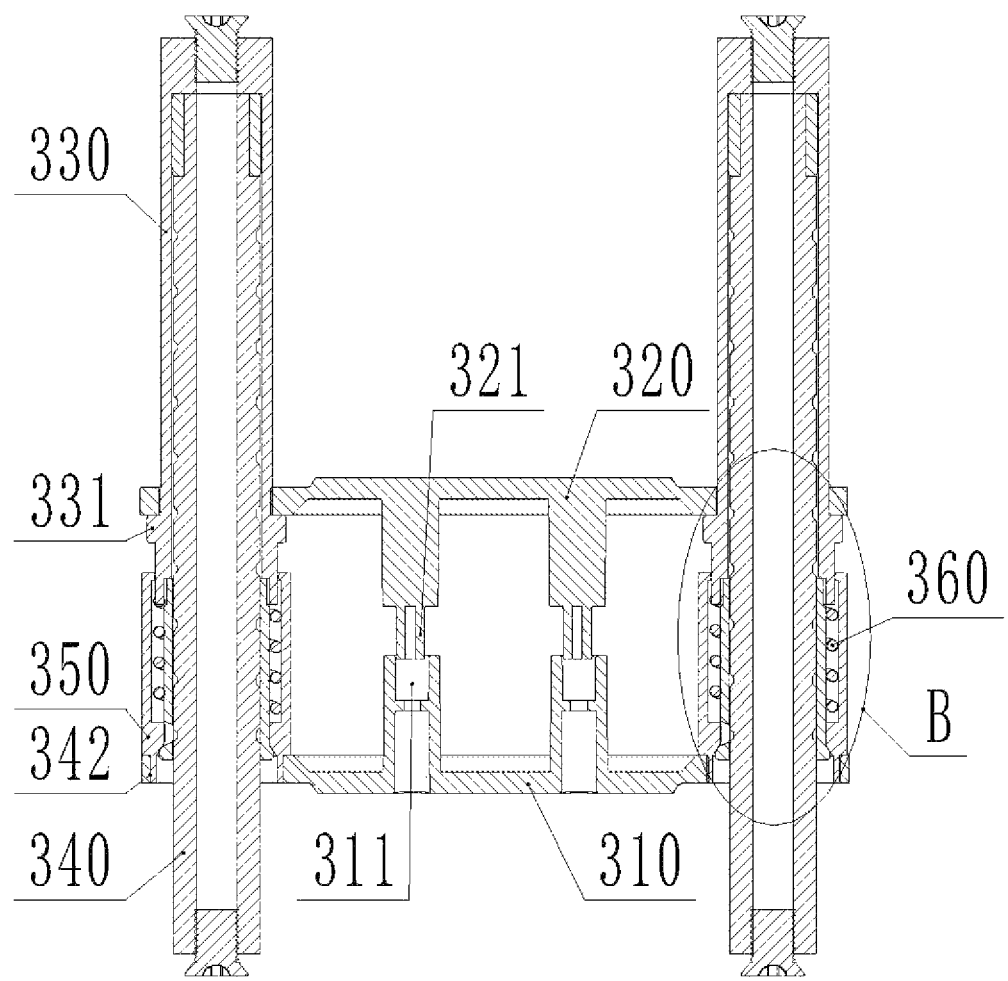
FIG. 5 is a sectional view of A-A in the FIG. 4.

As shown in FIG. 3 to FIG. 5, the expansion and retraction bracket 300 includes an expansion and retraction adjustment outer pipe 330 and an expansion and retraction adjustment inner pipe 340 that are telescopically connected. An expansion and retraction adjustment piece is arranged on the outer surface of the expansion and retraction adjustment outer pipe 330 in a sleeving manner. The expansion and retraction adjustment piece is axially connected to the expansion and retraction adjustment outer pipe 330 in a sliding manner. When the expansion and retraction adjustment piece and the expansion and retraction adjustment outer pipe 330 slide reciprocally axially, the expansion and retraction adjustment outer pipe 330 and the expansion and retraction adjustment inner pipe 340 slide telescopically relatively or are fixed relatively.

Specifically, referring to FIG. 3 to FIG. 6, through holes 371 are formed in the expansion and retraction adjustment outer pipe 330. A plurality of clamping grooves 341 matched with the through holes 371 are formed in the expansion and retraction adjustment inner pipe 340. The plurality of the clamping grooves 341 are distributed in the axial direction of the expansion and retraction adjustment inner pipe 340. The expansion and retraction adjustment piece includes a key spring clamping sleeve 350 and a gear adjustment steel ball 380. The key spring clamping sleeve 350 is arranged on the expansion and retraction adjustment outer pipe 330 in a sleeving manner. When the key spring clamping sleeve 350 and the expansion and retraction adjustment outer pipe 330 slide reciprocally axially, the gear adjustment steel ball 380 is clamped into or slides out corresponding through hole 371 and clamping groove. When the height and angle-adjustable foldable computer bracket is used, and when the key spring clamping sleeve 350 moves axially relative to the expansion and retraction adjustment outer pipe 330, the gear adjustment steel ball 380 can slide out of the through hole 371 and the clamping groove 341 under the action of the key spring clamping sleeve 350. When the key spring clamping sleeve 350 returns to the original position, the gear adjustment steel ball 380 can be clamped into the through hole 371 and the corresponding clamping groove 341 under the pushing action of the inside wall of the key spring clamping sleeve 350, so as to fix the expansion and retraction adjustment outer pipe 330 and the expansion and retraction adjustment inner pipe 340.

Preferably, the clamping groove 341 is an annular groove formed in the outer surface of the expansion and retraction adjustment inner pipe 340. The radial surface of the annular groove is the radial surface of the expansion and retraction adjustment inner pipe 340. The clamping groove 341 is arranged as an annular groove, which can ensure that the through hole 371 can also be correspond to the clamping groove 341 after the expansion and retraction adjustment inner pipe 340 rotates relative to the expansion and retraction outer pipe 330.

Figure 6:
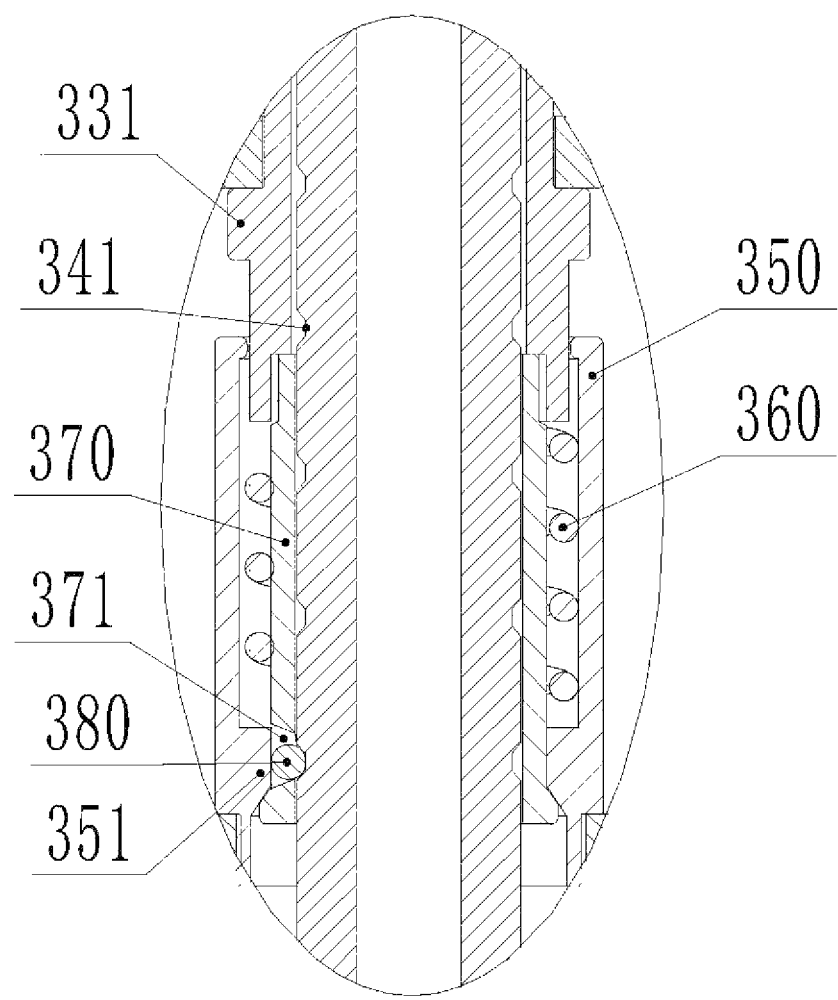
FIG. 6 is a partially enlarged view of position B in FIG. 5.

Specifically, as shown in FIG. 5 and FIG. 6, a spring 360 used for making the key spring clamping sleeve 350 and the expansion and retraction adjustment outer pipe 330 slide reciprocally axially is arranged between the key spring clamping sleeve 350 and the expansion and retraction adjustment outer pipe 330.

Specifically, as shown in FIG. 5 and FIG. 6, a ball fixing sleeve 370 is fixedly arranged in an end, in the key spring clamping sleeve 350, of the expansion and retraction adjustment outer pipe 330. The ball fixing sleeve 370 is arranged on the outer surface of the expansion and retraction adjustment inner pipe 340 in a sliding and sleeving manner. The through holes 371 are formed in the side wall of one end, far away from the expansion and retraction adjustment outer pipe 330, of the ball fixing sleeve 370. A bulge 351 used for pressing the gear adjustment steel ball 380 into the through hole 371 and the clamping groove 341 that are communicated with each other is formed on the inside wall of the key spring clamping sleeve 350. The spring 360 is arranged between the bulge 351 and the end, connected to the ball fixing sleeve 370, of the expansion and retraction adjustment outer pipe 330.

Specifically, as shown in FIG. 3 and FIG. 5, multiple expansion and retraction brackets 300 are arranged between the bottom plate 100 and the support plate 200. A linkage piece is arranged between every two of the multiple expansion and retraction brackets 300. The linkage pieces are used for driving the spring 360 to compress and can return to the original state under the returning force of the spring 360.

Specifically, as shown in FIG. 3 and FIG. 5, the linkage piece includes a first expansion and retraction key 310 and a second expansion and retraction key 320 that are telescopically matched with each other. The first expansion and retraction key 310 is connected outside the key spring clamping sleeves 350 of two adjacent expansion and retraction brackets 300 in a clamping manner. The second expansion and retraction key 320 is connected to the expansion and retraction adjustment outer pipes 330 of two adjacent expansion and retraction brackets 300 in a clamping manner. When the height and angle-adjustable foldable computer bracket is used, an operator can drive the ends of the expansion and retraction adjustment outer pipes 330 to slide in the direction of extending into the key spring clamping sleeve 350 by pressing the first expansion and retraction key 310 and the second expansion and retraction key 320 to make them get close to each other. At this time, the gear adjustment steel ball 380 can be brought out of the through hole 371 and the clamping groove 341 that are communicated with each other by the inside surface of the key spring clamping sleeve 350.

Specifically, as shown in FIG. 3 and FIG. 5, a chute 311 and a sliding column 321 that are telescopically connected are arranged on the opposite sides of the first expansion and retraction key 310 and the second expansion and retraction key 320. The chute 311 and the sliding column 321 are respectively arranged towards the first expansion and retraction key 310 and the second expansion and retraction key 320 in a convex manner, and the specific structure is as shown in FIG. 5. In order to reduce the weight, a weight reducing groove is formed in the sliding column 321. The first expansion and retraction key 310 and the second expansion and retraction key 320 are respectively arranged in plate shapes. As shown in FIG. 2, reinforcing ribs for improving strength are also arranged on the opposite side surfaces of the first expansion and retraction key 310 and the second expansion and retraction key 320.

Specifically, as shown in FIG. 5 and FIG. 6, a convex ring 331 is fixedly arranged on the expansion and retraction adjustment outer pipe 330 between the second expansion and retraction key 320 and the key spring clamping sleeve 350. The second expansion and retraction key 320 is arranged outside the expansion and retraction adjustment outer pipe 330 in a sleeving manner and is arranged close to the convex ring 331.

Specifically, as shown in FIG. 5, a hole 342 for the expansion and retraction adjustment inner pipe 340 to penetrate and slide relatively is formed in the first expansion and retraction key 310; one end, far away from the second expansion and retraction key 320, of the key spring clamping sleeve 350 is fixedly arranged on the inner surface of the hole 342.

Finally, it should be noted that the above-mentioned embodiments are only used to illustrate the technical solution of the present disclosure. Although the present disclosure is described in detail through the above-mentioned preferred embodiments, those skilled in the art should understand that the technical solution of the present disclosure can be replaced equally without departing from the scope of the technical solution of the present disclosure. All of them shall be covered in the scope of the claims of the present disclosure.

What is claimed is:

1. A height and angle-adjustable foldable computer bracket, comprising a bottom plate, a support plate, and expansion and retraction brackets connected between the bottom plate and the support plate, first connecting lugs being respectively arranged at a top of the bottom plate and a bottom of the support plate, second connecting lugs being arranged at two ends of the expansion and retraction brackets, and shaft holes being formed in the first connecting lugs and the second connecting lugs, wherein
   a rotating shaft structure is mounted between each first connecting lug and the corresponding second connecting lug;
   engaging teeth are formed in the shaft holes;
   the rotating shaft structure comprises: a rotating shaft with engaging teeth, a limiting shaft with engaging teeth, and a returning piece;
   the rotating shaft is mounted in a penetrating manner and is engaged with the first connecting lug and the second connecting lug to correspondingly limit a rotation between the bottom plate and the expansion and retraction brackets and the rotation between the support plate and the expansion and retraction brackets;
   the limiting shaft is mounted on the first connecting lug, and the limiting shaft moves axially to push the rotating shaft to be separated from the first connecting lug to correspondingly make the bottom plate rotate relative to the expansion and retraction brackets and make the support plate rotate relative to the expansion and retraction brackets;
   the returning piece provides a returning force for inserting the rotating shaft into the first connecting lug again.

2. The height and angle-adjustable foldable computer bracket according to claim 1, wherein each of the expansion and retraction brackets comprises an expansion and retraction adjustment outer pipe and an expansion and retraction adjustment inner pipe that are telescopically connected; an expansion and retraction adjustment piece is arranged on an outer surface of the expansion and retraction adjustment outer pipe in a sleeving manner; the expansion and retraction adjustment piece is axially connected to the expansion and retraction adjustment outer pipe in a sliding manner, when the expansion and retraction adjustment piece and the expansion and retraction adjustment outer pipe slide reciprocally axially, the expansion and retraction adjustment outer pipe and the expansion and retraction adjustment inner pipe slide telescopically relatively or are fixed relatively.

3. The height and angle-adjustable foldable computer bracket according to claim 2, wherein through holes are formed in the expansion and retraction adjustment outer pipe;
   a plurality of clamping grooves are formed in the expansion and retraction adjustment inner pipe to match with the through holes;

the plurality of the clamping grooves are distributed in an axial direction of the expansion and retraction adjustment inner pipe; the expansion and retraction adjustment piece comprises a key spring clamping sleeve and a gear adjustment steel ball;

the key spring clamping sleeve is arranged on the expansion and retraction adjustment outer pipe in a sleeving manner; when the key spring clamping sleeve and the expansion and retraction adjustment outer pipe slide reciprocally axially, the gear adjustment steel ball is clamped into or slides out corresponding through hole and clamping groove.

4. The height and angle-adjustable foldable computer bracket according to claim 3, wherein a spring used for making the key spring clamping sleeve and the expansion and retraction adjustment outer pipe slide reciprocally axially is arranged between the key spring clamping sleeve and the expansion and retraction adjustment outer pipe.

5. The height and angle-adjustable foldable computer bracket according to claim 4, wherein a ball fixing sleeve is fixedly arranged in an end, in the key spring clamping sleeve, of the expansion and retraction adjustment outer pipe; the ball fixing sleeve is arranged on an outer surface of the expansion and retraction adjustment inner pipe in a sliding and sleeving manner; the through holes are formed in a side wall of one end, far away from the expansion and retraction adjustment outer pipe, of the ball fixing sleeve; a bulge used for pressing the gear adjustment steel ball into the through hole and the clamping groove that are communicated with each other is formed on an inside wall of the key spring clamping sleeve; the spring is arranged between the bulge and the end, connected to the ball fixing sleeve, of the expansion and retraction adjustment outer pipe.

6. The height and angle-adjustable foldable computer bracket according to claim 5, wherein; a linkage piece is arranged between every two of the expansion and retraction brackets; the linkage pieces are used for driving the spring to compress.

7. The height and angle-adjustable foldable computer bracket according to claim 6, wherein the linkage piece comprises a first expansion and retraction key and a second expansion and retraction key that are telescopically matched with each other; the first expansion and retraction key is connected outside the key spring clamping sleeves of two adjacent expansion and retraction brackets in a clamping manner; the second expansion and retraction key is connected to the expansion and retraction adjustment outer pipes of two adjacent expansion and retraction brackets in a clamping manner.

8. The height and angle-adjustable foldable computer bracket according to claim 7, wherein a chute and a sliding column that are telescopically connected are arranged on an opposite sides of the first expansion and retraction key and the second expansion and retraction key.

9. The height and angle-adjustable foldable computer bracket according to claim 7, wherein a convex ring is fixedly arranged on the expansion and retraction adjustment outer pipe between the second expansion and retraction key and the key spring clamping sleeve; the second expansion and retraction key is arranged outside the expansion and retraction adjustment outer pipe in a sleeving manner and is arranged close to the convex ring.

10. The height and angle-adjustable foldable computer bracket according to claim 7, wherein a hole for the expansion and retraction adjustment inner pipe to penetrate and slide relatively is formed in the first expansion and retraction key; one end, far away from the second expansion and retraction key, of the key spring clamping sleeve is fixedly arranged on the inner surface of the hole.

\* \* \* \* \*